United States Patent
Fitelson et al.

(10) Patent No.: US 10,720,572 B1
(45) Date of Patent: Jul. 21, 2020

(54) SKYRMION STACK MEMORY DEVICE

(71) Applicants: Michael M. Fitelson, Columbia, MD (US); Thomas F. Ambrose, Crownsville, MD (US); Nicholas D. Rizzo, Gilbert, AZ (US)

(72) Inventors: Michael M. Fitelson, Columbia, MD (US); Thomas F. Ambrose, Crownsville, MD (US); Nicholas D. Rizzo, Gilbert, AZ (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/273,777

(22) Filed: Feb. 12, 2019

(51) Int. Cl.
 *H01L 43/08* (2006.01)
 *H01L 43/02* (2006.01)
 *H01L 43/10* (2006.01)

(52) U.S. Cl.
 CPC .............. *H01L 43/08* (2013.01); *H01L 43/02* (2013.01); *H01L 43/10* (2013.01)

(58) Field of Classification Search
 CPC .......... H01L 43/08; H01L 43/10; H01L 43/02
 USPC ....................................................... 257/421
 See application file for complete search history.

(56) References Cited

U.S. PATENT DOCUMENTS

| | | | |
|---|---|---|---|
| 9,653,136 B2 | 5/2017 | Cros et al. | |
| 2016/0247550 A1* | 8/2016 | Fukami | H01L 43/08 |
| 2019/0074044 A1* | 3/2019 | Atulasimha | G11C 11/1659 |
| 2019/0214548 A1* | 7/2019 | Schabes | H01L 27/222 |
| 2019/0305212 A1* | 10/2019 | Gosavi | H01L 43/10 |
| 2020/0005861 A1* | 1/2020 | O'Brien | H01F 10/329 |
| 2020/0006628 A1* | 1/2020 | O'Brien | H01F 10/3254 |

OTHER PUBLICATIONS

Koshibae et al.: "Memory Functions of Magnetic Skyrmions"; Japanese Journal of Applied Physics 54, 053001 (2015); http://dx/doi.org/10.7567/JJAP.54.053001.

* cited by examiner

*Primary Examiner* — Fernando L Toledo
*Assistant Examiner* — Adam S Bowen
(74) *Attorney, Agent, or Firm* — Tarolli, Sundheim, Covell & Tummino LLP

(57) ABSTRACT

A memory device includes a memory stack formed on a substrate to program skyrmions within at least one layer of the stack. The skyrmions represent logic states of the memory device. The memory stack further includes a top and bottom electrode to receive electrical current from an external source and to provide the electrical current to the memory stack. A free layer stores a logic state of the skyrmions in response to the electrical current. A Dzyaloshinskii-Moriya (DM) Interaction (DMI) layer in contact with the free layer induces skyrmions in the free layer. A tunnel barrier is interactive with the DMI layer to facilitate detection of the logic state of the skyrmions in response to a read current. At least one fixed magnetic (FM) layer is positioned within the memory stack to facilitate programming of the skyrmions within the free layer in response to the electrical current.

18 Claims, 5 Drawing Sheets

SKYRMION STACK MEMORY DEVICE

TECHNICAL FIELD

This disclosure relates to skyrmion-based magnetic memory devices.

BACKGROUND

Some proposed skyrmion memories include chiral-magnetic configurations in which magnetic skyrmions are used as a support for a multi-state memory element. The memory element uses as a base structure designated as BS hereafter, a thin film multilayer system that includes film thicknesses of a few atomic planes which are much smaller than the other dimensions of the system, including a nanostructure consisting of at least one stack of an ultra-thin layer of a ferromagnetic material and of a layer of a non-magnetic metal. The magnetic ultra-thin film is replaced with a stack of layers comprising ferromagnetic layer(s) (and optionally non-ferromagnetic layer(s)), such as for example Co/Ni/Co/Ni. Such previous memory architectures may utilize a track-like structure for storage and retrieval of skyrmions where it may be difficult to reliably read and write desired data utilizing such structure.

SUMMARY

This disclosure relates to multilayer memory devices. In one example, a memory device includes a memory stack formed on a substrate to program skyrmions within at least one layer of the stack. The skyrmions represent logic states of the memory device. The memory stack further includes a top and bottom electrode to receive electrical current from an external source and to provide the electrical current to the memory stack. A free layer stores a logic state of the skyrmions in response to the electrical current. A Dzyaloshinskii-Moriya (DM) Interaction (DMI) layer in contact with the free layer induces the skyrmions in the free layer. A tunnel barrier is interactive with the free layer to facilitate detection of the logic state of the skyrmions in response to a read current. At least one fixed magnetic (FM) layer is positioned within the memory stack to facilitate programming and reading of the skyrmions within the free layer in response to the electrical current.

In another example, a memory device includes a memory stack formed on a substrate to program skyrmions within at least one layer of the memory stack. The skyrmions represent logic states of the memory device. The memory stack includes top and bottom electrodes to receive electrical current from an external source and to provide the electrical current to the memory stack. A free layer stores a logic state of the skyrmions in response to the electrical current. A Dzyaloshinskii-Moriya (DM) Interaction (DMI) layer in contact with the free layer induces the skyrmions in the free layer. A tunnel barrier interactive with the DMI layer facilitates storage and retrieval of the skyrmions in the free layer. Skyrmions of a positive topological charge +Q are created in the free layer by applying a voltage to the top and bottom electrodes to cause the electrical current to flow in one direction and the skyrmions of negative topological charge −Q are created in the free layer by reversing the voltage to the top and bottom electrodes to cause the electrical current to flow in the opposite direction in the memory stack.

In yet another example, a memory device includes a memory stack formed on a substrate to program skyrmions within at least one layer of the memory stack that includes stack side-edges that define the perimeter of the stack. The skyrmions represent logic states of the memory device. The memory stack includes a top and bottom electrode to receive electrical current from an external source and to provide the electrical current to the memory stack. A free layer stores a logic state of the skyrmions in response to the electrical current. A Dzyaloshinskii-Moriya (DM) Interaction (DMI) layer in contact with the free layer induces skyrmion in the free layer. The free layer is coupled to read electrodes to facilitate detection of the skyrmions in the free layer. A tunnel barrier is interactive with the free layer to facilitate programming and reading of the skyrmions in the free layer. The DMI layer includes layer side-edges that extend beyond the perimeter defined by the memory stack side-edges, the layer side-edges coupled to the read electrodes to facilitate programming of the skyrmions in the free layer.

DETAILED DESCRIPTION

The present disclosure relates to a non-volatile memory device that employs skyrmion technology that is fabricated as a layered stack of materials. The memory device is based on programming of skyrmions for writing and reading a high speed, non-volatile memory. In one example, programming can include creation of skyrmions to represent one logic state and the annihilation of skyrmions to represent another logic state. In another example, skyrmions can be polarized (e.g. to have positive topological charge +Q) by an electrical current to represent a first logic state and polarized in another direction (e.g. to have the opposite topological charge −Q) to represent a second logic state. Magnetic skyrmions are nanometer-sized states having spatially non-uniform, swirling magnetization similar to magnetic vortices. Their existence is induced in a magnetic layer by the Dzyaloshinskii-Moriya Interaction (DMI) from an adjacent layer, which stabilizes the localized skyrmion structure. The size of the skyrmion, which determines the size of the memory cell is approximately inversely proportional to the strength DMI interaction and directly proportional to the strength of the magnetic exchange within the structure. Therefore, it is desirable to maintain the magnetic exchange as small as possible in the structure, while maintaining a large DMI.

The memory stack utilizes materials such as Pt/CoFeB/MgO multilayers that have a large DMI at room temperature, for which skyrmions/anti skyrmions can be created or annihilated in one programming example or spin polarized with either ±Q in another programing example. This allows fabricating a memory cell using magneto resistance to distinguish between the presence absence, polarity, and/or type of a skyrmion that is stored. A stack of layers can be fabricated where upward going current in the stack creates a skyrmion with a positive topological charge +Q (e.g., representing a logic 1), and a downward going current in the stack can either annihilate the skyrmion to create an alternative magnetic state such as uniform magnetization, or can create a skyrmion with a negative topological charge –Q (e.g., representing a logic 0). Thus, the presence of a skyrmion with +Q would indicate a logic one and the absence of a skyrmion, or presence of a skyrmion with –Q would indicate a logic zero, for example. A small current applied to one of the layers in the stack can then be used to read the state via magneto-resistance, for example.

The disclosed layered skyrmion memory facilitates increasing the density and speed of non-volatile memory, while reducing power. This can provide a memory that is comparable to static random-access memory (SRAM) and high density similar to DRAM and FLASH. This memory structure can be applied to space-based systems, unattended sensors, airborne sensors, and other sensors or systems that employ large amounts of backup memory in case of system failure.

Figure 1:
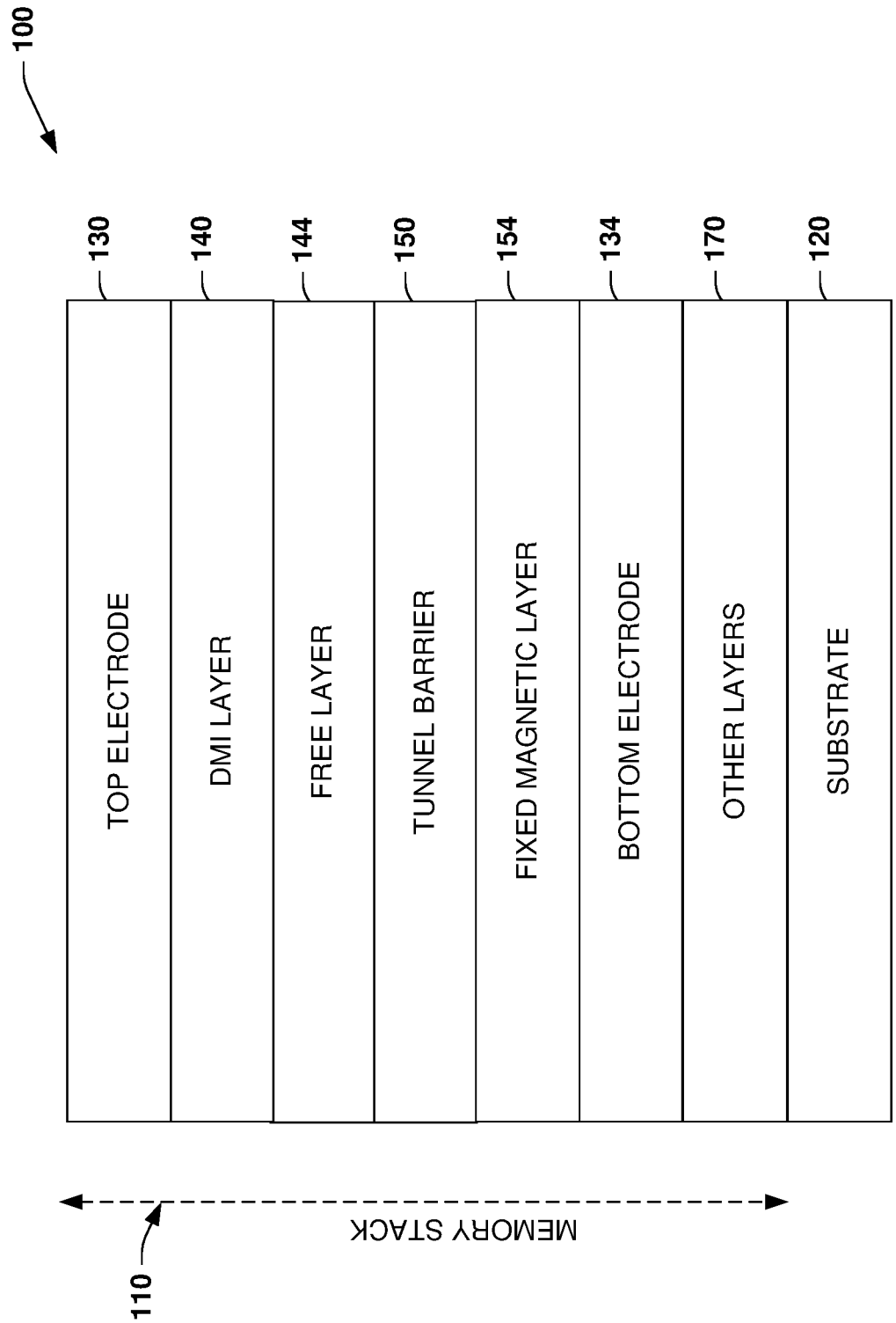
FIG. 1 illustrates an example of a skyrmion stack memory device.

FIG. 1 illustrates an example of a skyrmion stack memory device 100. More generally, the term skyrmion is a topologically-stable field configuration of a certain class of non-linear sigma models. It was originally proposed as a model of the nucleon by Tony Skyrme in the early 1960's. One form of skyrmions as described herein includes magnetic skyrmions, found in magnetic materials that exhibit spiral magnetism due to the Dzyaloshinskii-Moriya (DM) interaction, double-exchange mechanism or competing Heisenberg exchange interactions. They form "domains" as small as 10 nm, where the small size and low energy consumption of magnetic skyrmions make them a suitable candidate for data storage solutions and other spintronics devices. The topological charge ±Q, or the existence and non-existence of skyrmions, can represent the bit states "1" and "0". The topological charge can be defined as $Q=\frac{1}{4\pi}\int m \cdot (\partial_x m \times \partial_y m) dx dy$ where m is the local magnetization of the free layer. Also, as used herein the term stack refers to a layered structure where one layer of the stack is formed on another layer with respect to a substrate layer which can also be referred to as a bottom or base layer from which other succeeding layers are referenced to and thus formed thereon. In some examples, respective layers are shown above other layers whereas in other examples, the respective layers may be implemented beneath the other layers.

The memory device 100 includes a memory stack 110 formed on a substrate 120 to program skyrmions (e.g., create, annihilate, polarize, modify) within at least one layer of the stack. The skyrmions represent logic states of the memory device 100. The memory stack 110 further includes a top electrode 130 and bottom electrode 134 to receive electrical current from an external source (not shown) and to provide the electrical current to the memory stack. A Dzyaloshinskii-Moriya (DM) Interaction (DMI) layer 140 is in contact with a free layer 144 (e.g., a ferromagnetic material) to induce a skyrmion logic state that is suitably stable in the free layer and in response to the electrical current. A tunnel barrier 150 is interactive with the free layer 144 to facilitate programming and detection of the logic state of the skyrmions in response to a write or read current. The read current is a separate and smaller current than the electrical programming current and is applied to one or more layers of the memory stack 110 to detect the presence, absence, or type of skyrmions (e.g., charge type ±Q depending on the direction programming current was applied). The read current is applied below a predetermined threshold current so as not to affect the state of skyrmions that are stored in the free layer 144 and/or in conjunction with another layer. At least one fixed magnetic (FM) layer 154 is positioned within the memory stack 110 to facilitate programing of the skyrmions within the free layer 144 and in response to the electrical current employed for programming and to facilitate reading in response to the electrical current employed for reading. As shown, one or more other layers 170 can be provided to facilitate operation of the memory stack 110 and are described herein below. Various orderings and arrangements of the respective layers in the memory stack 110 other than shown in the example of FIG. 1 and are illustrated and described below with respect to FIGS. 2-5.

Skyrmions can be created/programmed in the free layer 140 and/or other layers by applying a voltage to the top electrode 130 and bottom electrode 134 to cause the electrical current to flow in one direction where the skyrmions are created, annihilated, or polarized in the free layer 144, and by changing the voltage to the top and bottom electrodes to cause the electrical current to flow in the opposite direction in the memory stack 110. One of the other layers 170 can include a dielectric layer (see e.g., FIGS. 2-5) that is formed on the substrate layer 120. The memory stack 110 can be formed on the dielectric layer, where the dielectric layer can be silicon dioxide ($SiO_2$) for example, and the substrate can be silicon, for example. The memory stack 110 can also include at least one non-magnetic layer to facilitate programming of the skyrmions within the free layer 144 in response to the electrical current.

In one programming example, skyrmions can be created in the free layer 144 by applying a voltage to the top electrode 130 and bottom electrode 134 to cause the electrical current to flow in one direction to create a first logic state, and the skyrmions can be annihilated in the free layer by reversing the voltage to the top and bottom electrodes to cause the electrical current to flow in the opposite direction in the memory stack 110 to create a second logic state. In another programming example, the skyrmions can be of a positive topological charge +Q (e.g., causing them to spin about an axis in a given direction) can be created in the free layer 144 by applying a voltage to the top electrode 130 in a first direction by the electrical current flowing in one direction representing a first logic state. Skyrmions of negative topological charge –Q can be created in the free layer by reversing the voltage to the top and bottom electrodes to cause the electrical current to flow in the opposite direction in the memory stack 110 representing a second logic state.

In this embodiment, the programming current can create, annihilate or modify the skyrmions in the free layer through the spin torque effect, which is well known in the prior art. In brief, a spin torque can be applied to the free layer by passing a current through the memory stack 110. The free layer and fixed layer create spin polarization in the electrical current which results in torque applied to the magnetization of the free layer, since a change in spin polarization corresponds to change in angular momentum which is a torque by definition.

Various materials can be employed to provide the various layers as described herein. For example, the free layer 144 can include a magnetic alloy of at least one of a Ni, Fe, or Co alloy, a CoFeB alloy, an FeB alloy, a Co/Ni multilayer configuration, and a CoFeGd alloy, wherein Co is Cobalt, Fe is Iron, B is Boron, Ni is nickel, and Gd is Gadolinium. The DMI layer 140 can include at least one of Ta, W, Pt, Hf, Ir, Au, and AuPt alloy, wherein Ta is Tantalum, Pt is Platinum, Hf is Hafnium, Ir is Iridium, and Au is Gold. The fixed magnetic layer 154 can include at least one of CoFe, CoFeB, alloys of Ni, Fe, and Co layers, synthetic anti-ferromagnetic layers that include Ru spacer layers and antiferromagnetic pinning layers that include PtMn, IrMn, or FeMn, wherein Co is Cobalt, Fe is Iron, B is Boron, Pt is Platinum, Ir is Iridium, and Mn is Manganese. The tunnel barrier can include at least one of MgO and $Al_2O_3$, for example, wherein Mg is Magnesium, O is Oxygen, and Al is Aluminum.

Figure 2:
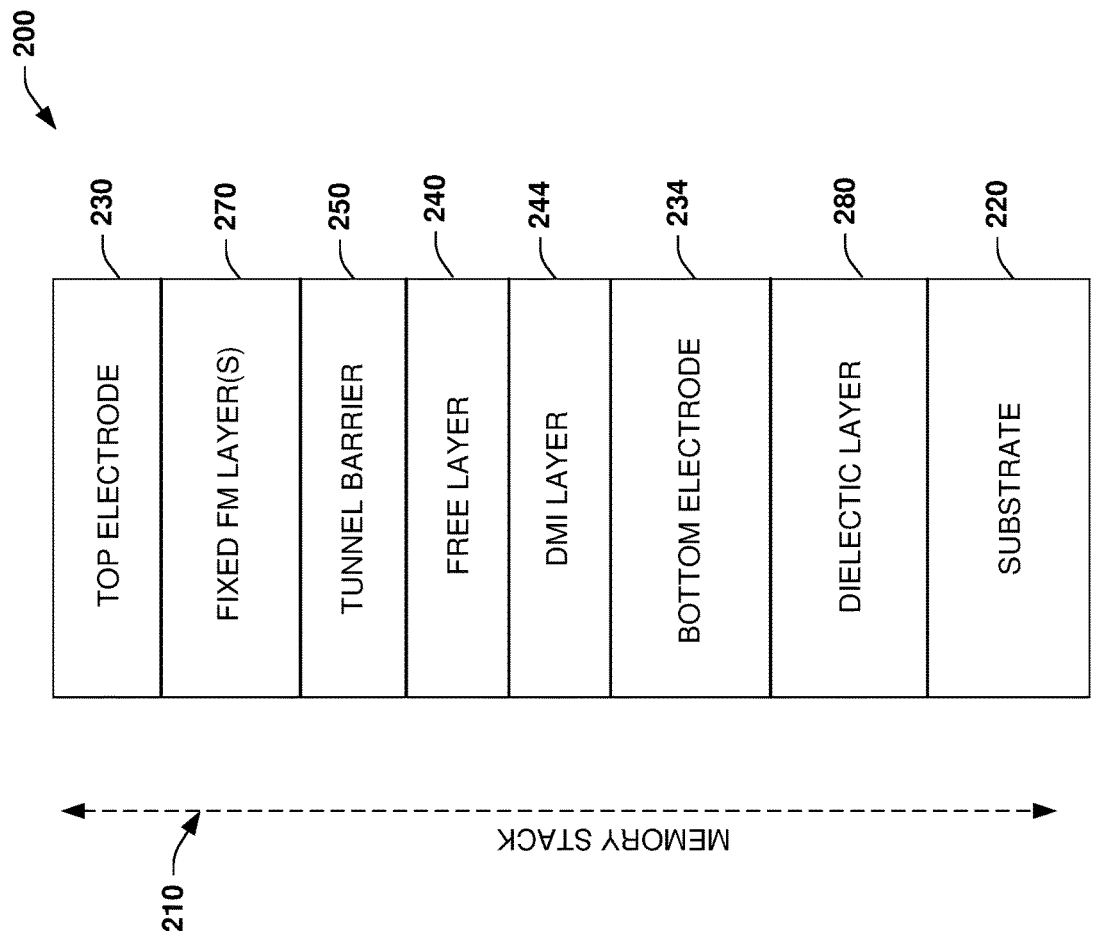
FIG. 2 illustrates an example of a skyrmion stack memory device having a top-pinned configuration of memory stack layers with respect to a bottom substrate layer.

FIG. 2 illustrates an example of a skyrmion stack memory device 200 having a top-pinned configuration of memory stack layers with respect to a bottom substrate layer. The memory device 200 includes a memory stack 210 formed on a substrate 220 to create or annihilate skyrmions within at least one layer of the memory stack. As mentioned previously, the programming of the skyrmions include creation, annihilation, polarization and so forth to represent logic states of the memory device 200. The memory stack 210 includes a top electrode 230 and bottom electrode 234 to receive electrical current from an external source and to provide the electrical current to the memory stack. A free layer 240 operative with a DMI layer 244 stores the logic state of the skyrmion in response to the electrical current. A tunnel barrier 250 interactive with the free layer 240 facilitates storage, retrieval, and readout of the skyrmions in the free layer.

At least one fixed magnetic (FM) layer 270 and at least one non-magnetic layer (not shown—see e.g., FIG. 5) can be positioned within the memory stack 210 to facilitate programming and reading of the skyrmions within the free layer 240 in response to the electrical current. The memory stack 210 in this example is formed as a top-pinned configuration which refers to the positioning of the tunnel barrier 250. Thus, in this example, the tunnel barrier 250 is formed above the free layer 240 which in turn is formed above the DMI layer 244 with respect to a base substrate layer 220. As shown in this example, a dielectric layer 280 can be formed above the substrate 220 from which the bottom electrode 234 is formed.

Figure 3:
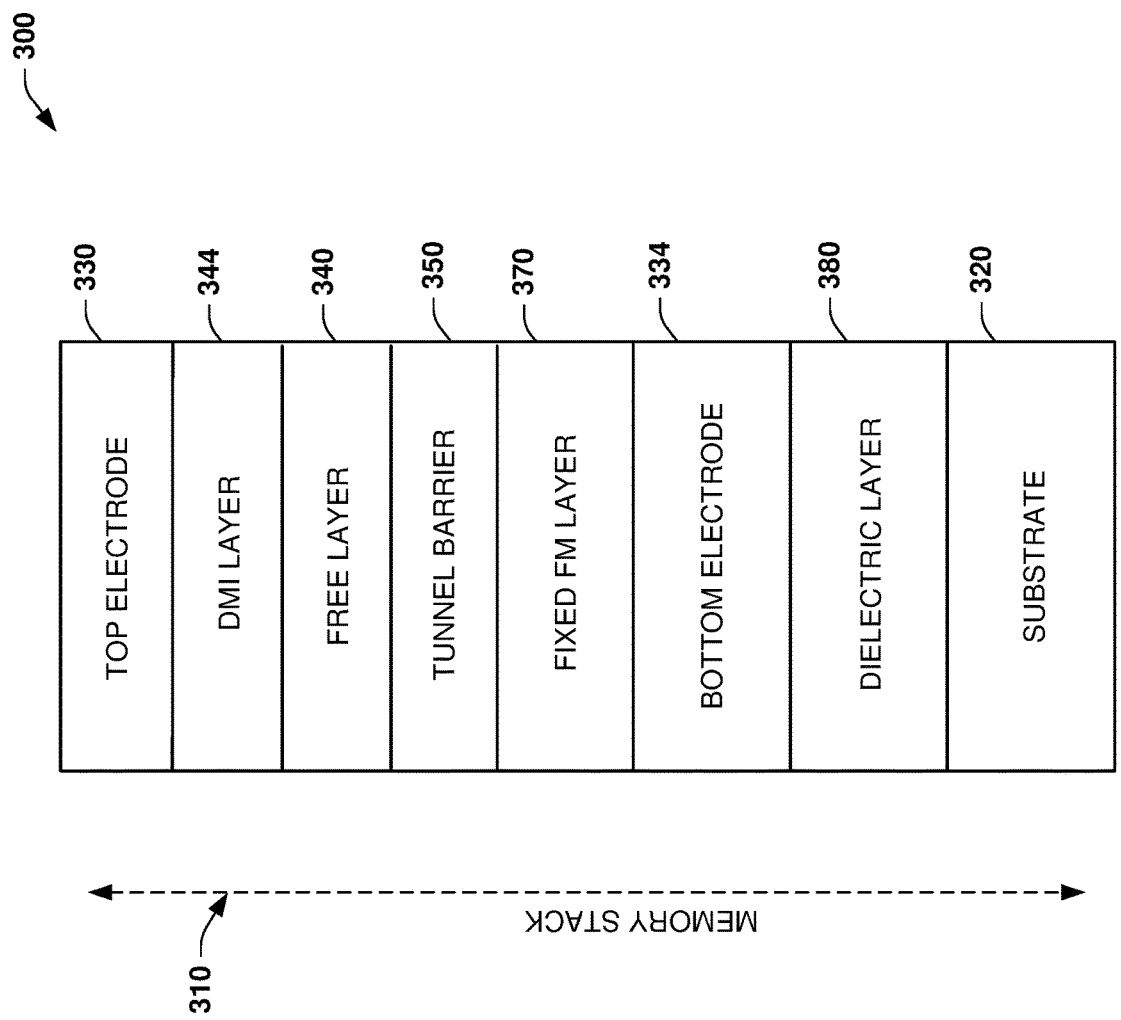
FIG. 3 illustrates an example of a skyrmion stack memory device having a bottom-pinned configuration of memory stack layers with respect to a bottom substrate layer.

FIG. 3 illustrates an example of a skyrmion stack memory device 300 having a bottom-pinned configuration of memory stack layers with respect to a bottom substrate layer. The memory device 300 includes a memory stack 310 formed on a substrate 320 to program skyrmions within at least one layer of the memory stack. The memory stack 310 includes a top electrode 330 and bottom electrode 334 to receive electrical current from an external source and to provide the electrical current to the memory stack. A free layer 340 is interactive with a DMI layer 344 to store the skyrmion in the free layer in response to the electrical current. A tunnel barrier 350 interactive with the DMI layer 344 facilitates storage, retrieval, and readout of the skyrmions in the free layer 340.

At least one fixed magnetic (FM) layer 370 and at least one non-magnetic layer can be positioned within the memory stack 310 to facilitate programming and reading of the skyrmions within the free layer 340 in response to the electrical current. The memory stack 310 in this example is formed as a bottom-pinned configuration which refers to the positioning of the tunnel barrier 350. Thus, in this example, the tunnel barrier 350 is formed below the free layer 340 which is formed below the DMI layer 344 with respect to a base substrate layer 320. As shown in this example, a dielectric layer 380 can be formed above the substrate 320 from which the bottom electrode 334 is formed.

Figure 4:
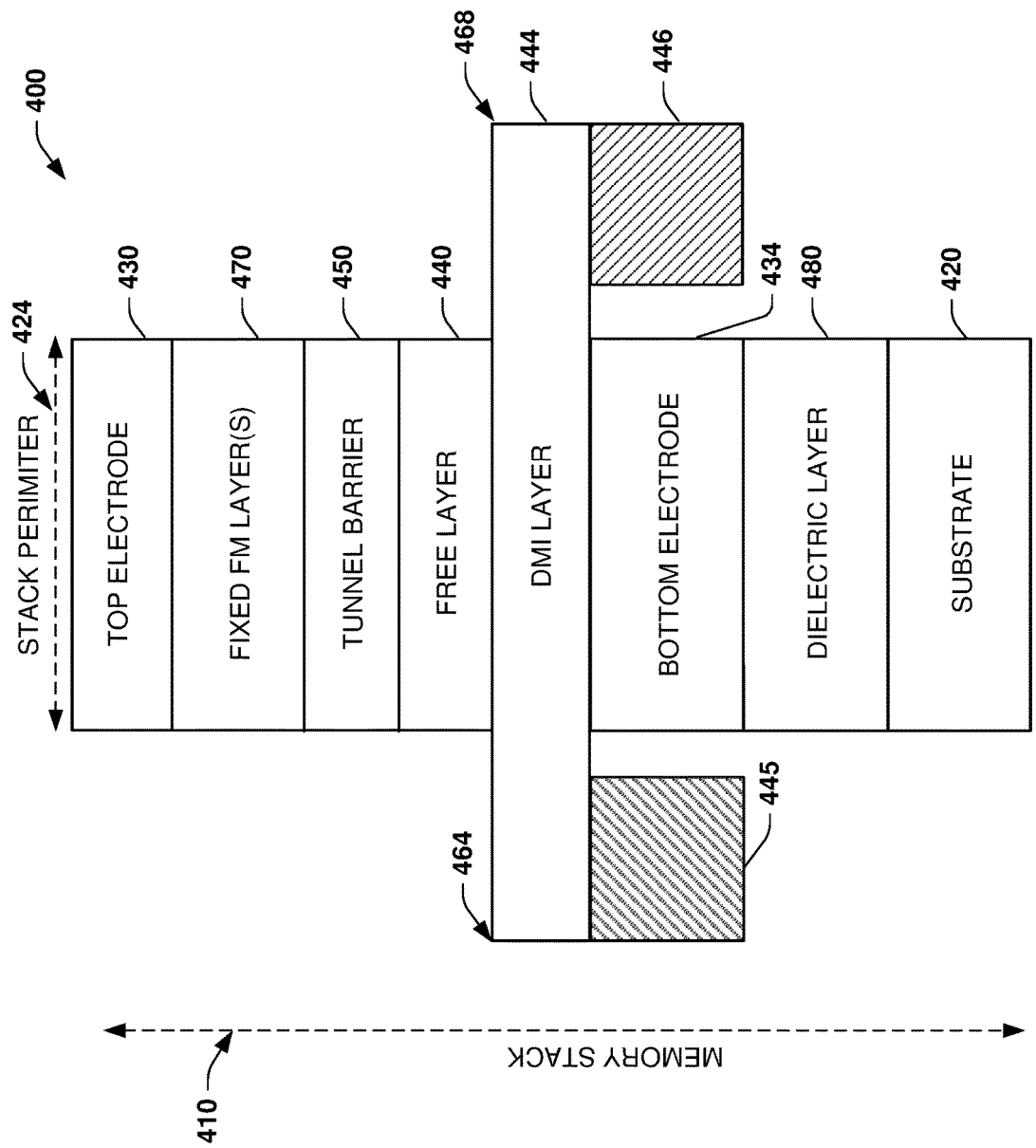
FIG. 4 illustrates an example of a skyrmion stack memory device having an extended DMI layer and electrodes to facilitate reading of the memory device.

FIG. 4 illustrates an example of a skyrmion stack memory device 400 having an extended DMI layer and electrodes to facilitate writing and reading of the memory device. The memory device 400 includes a memory stack 410 formed on a substrate 420 to program skyrmions within at least one layer of the memory stack that includes stack side-edges that define the perimeter of the stack as shown at reference line 424. The memory stack 410 includes a top electrode 430 and bottom electrode 434 to receive electrical current from an external source and to provide the electrical current to the memory stack. A free layer 440 stores the skyrmion in response to the electrical current. A DMI layer 444 is coupled to electrodes 445 and 446 to facilitate writing or reading of the skyrmions stored in the free layer 440 in the presence of a voltage applied to the electrodes. In this example, current through the DMI layer 444 can write skyrmions in the free layer 440 using the spin hall effect. This is in contrast to write currents through a tunnel barrier 450 which can program the free layer 440 using the spin torque effect in another example. The spin hall effect consists of accumulation of polarized spins at the surfaces of a current carrying material. The effect is typically strong in materials with strong spin-orbit coupling, which is the same coupling that also typically creates a strong DMI effect. The polarized spin current creates a torque that can program the free layer similar to the previous embodiment where a spin polarized current through the fixed and free layers was used to program the free layer.

The tunnel barrier 450 is interactive with the free layer 440 to facilitate writing and reading of the skyrmions in the free layer. As shown, the DMI layer includes layer side-edges shown at reference numerals 464 and 468 that extend beyond the perimeter defined by the memory stack side-edges at 424. The layer side-edges 464 and 468 are coupled to the electrodes 445 and 446 to facilitate writing and reading of the skyrmions in the free layer 440. In some examples, current may flow through the DMI layer 440 and the free layer 460 when skyrmion data is programmed by applying voltage to generate current flow through the electrodes 445 and 446.

In other examples, current may flow through the DMI layer 444 the tunnel barrier 450, and the free layer 440 when skyrmion data is programmed or read by applying voltage to the electrodes 430, and one of 434, 445, or 446. In still other examples, skyrmion data is programmed by applying voltage to generate current flow through the electrodes 445 and 446, and concurrently applying voltage to generate current flow through the DMI layer, free layer, tunnel barrier and fixed layer by applying voltage to the electrodes 430, and one of 434, 445, or 446. It is noted that that bottom electrode 434 can be provided as an optional electrode and may be eliminated for simplicity, since only 3 electrodes are employed to program and read the device when the spin hall effect, for example, is used for programming. Also, at least one fixed magnetic (FM) layer 470 and at least one non-magnetic layer (not shown) can be positioned within the memory stack 410 to facilitate programming and reading of the skyrmions within the free layer 440 in response to the electrical current. A dielectric layer 480 can also be formed on the substrate 420 as previously described herein.

Figure 5:
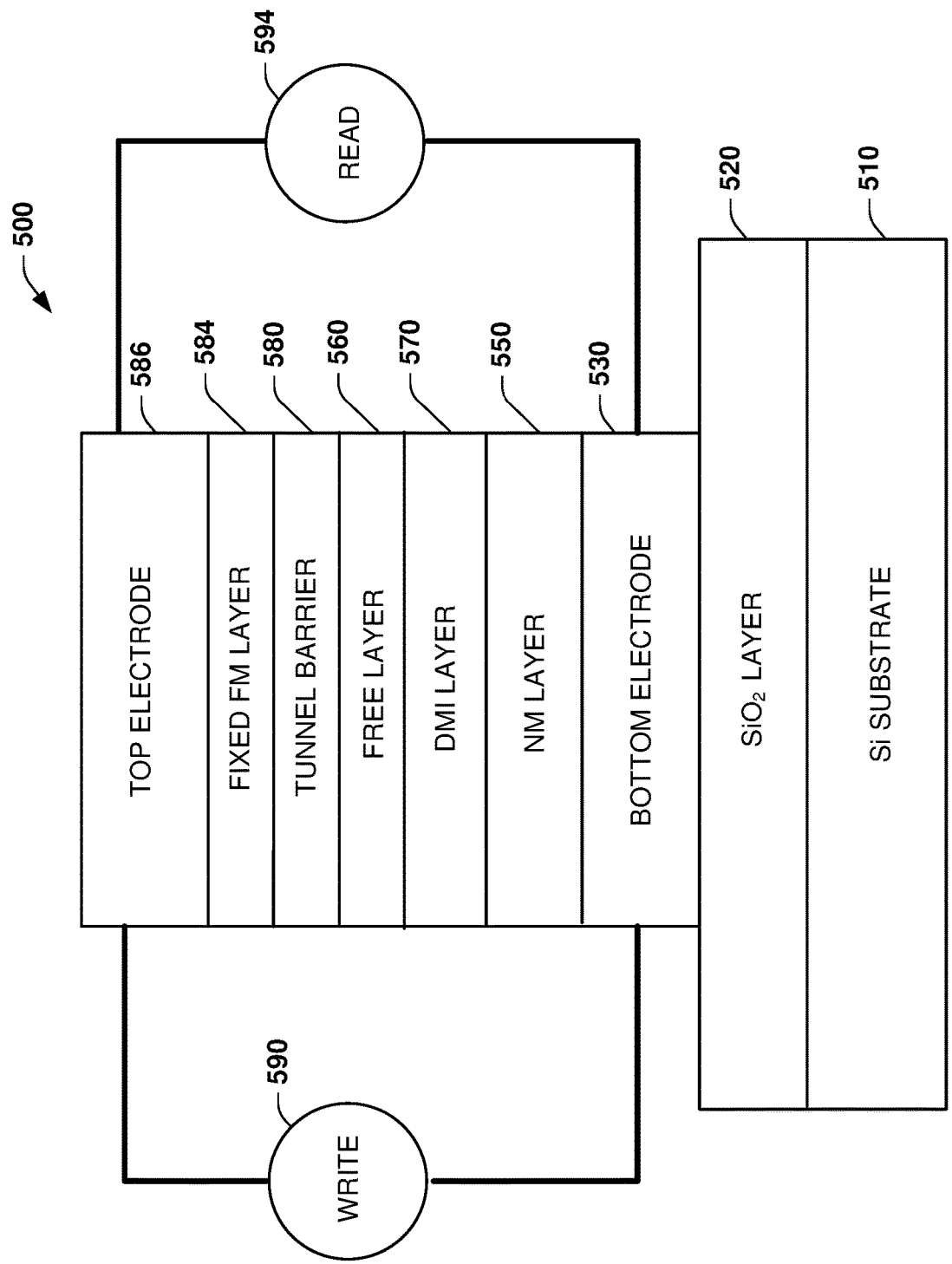
FIG. 5 illustrates an example of a skyrmion stack memory device having at least one non-magnetic layer.

FIG. 5 illustrates an example of a skyrmion stack memory device 500 having at least one non-magnetic layer. In this example, the memory device 500 includes a silicon substrate 510 having a silicon dioxide dielectric layer 520 formed thereon. A bottom electrode 530 is formed on the dielectric layer 520. A nonmagnetic metal layer 550 is formed on the bottom electrode 530 having a DMI layer 570 formed thereon. (figure shows DMI layer on 550). A free layer 560 is formed on the DMI layer 570 having a tunnel barrier 580 formed thereon. A fixed FM layer is shown at 584 with a top electrode 586 formed thereon. A programming source 590 applies voltage to the top and bottom electrodes 586 and 530, respectively. When the voltage of the source 590 is of one polarity, skyrmions are created (or polarized) in the free layer 560. When the opposite polarity from the source 590 is applied, skyrmions are annihilated (or polarized in opposite direction) in the free layer 560. A read source 594 is shown for detecting the state of skyrmions in the memory device 500. The read source 594 applies a lower voltage than the programming source 590 in order that stored skyrmion states in the free layer are not disturbed during read operations.

The memory device 500 utilizes materials such as Pt/Co/MgO layers that have a large DMI at room temperature, for which skyrmions/anti skyrmions can be created, annihilated, or modified with spin polarized current, and with no external magnetic field applied. This allows fabricating a memory cell using magneto resistance to distinguish between the presence, absence, or polarization state of a skyrmion.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A memory device, comprising:
   a memory stack formed on a substrate to program skyrmions within at least one layer of the memory stack, wherein the skyrmions represent logic states of the memory device, the memory stack further comprising:
   a top and bottom electrode to receive electrical current from an external source and to provide the electrical current to the memory stack;
   a free layer to store a logic state of the skyrmions in response to the electrical current;
   a Dzyaloshinskii Moriya Interaction (DMI) layer in contact with the free layer to induce a skyrmion in the free layer;
   a tunnel barrier interactive with the DMI layer to facilitate detection of the logic state of the skyrmions in response to a read current;
   at least one non-magnetic layer in contact with the DMI layer; and
   at least one fixed magnetic (FM) layer positioned within the memory stack, the at least one fixed FM layer with the at least one non-magnetic layer being configured to facilitate programming and reading of the skyrmions within the free layer in response to the electrical current.

2. The memory device of claim 1,
   wherein the skyrmions are created in the free layer based on a first voltage at the top and bottom electrodes, the first voltage at the top and bottom electrodes causing the electrical current to flow in first direction to create a first logic state, and
   wherein the skyrmions are annihilated in the free layer based on a second voltage at the top and bottom electrodes, the second voltage at the top and bottom electrodes causing the electrical current to flow in a second direction opposite the first direction in the memory stack to create a second logic state.

3. The memory device of claim 1, wherein the skyrmions are polarized in a first direction in response to the electrical current flowing in a first direction representing a first logic state and are polarized in a second direction in response to the electrical current flowing in a second direction that is opposite of the first direction representing a second logic state.

4. The memory device of claim 1,
   wherein skyrmions of a positive topological charge +Q are created in the free layer based on a first voltage at the top and bottom electrodes, the first voltage at the top and bottom electrodes causing the electrical current to flow in a first direction, and
   wherein the skyrmions of negative topological charge −Q are created in the free layer based on a second voltage at the top and bottom electrodes, the second voltage at the top and bottom electrodes causing the electrical current to flow in a second direction opposite the first direction in the memory stack.

5. The memory device of claim 1, further comprising a dielectric layer that is formed on a substrate layer, the memory stack formed on the dielectric layer, wherein the dielectric layer is silicon dioxide ($SiO_2$), and the substrate is silicon.

6. The memory device of claim 1, wherein the DMI layer includes layer side-edges that extend beyond a perimeter defined by memory stack side-edges of the memory stack, the layer side-edges coupled to electrodes to facilitate programming and detection of the skyrmions in the free layer.

7. The memory device of claim 1, wherein the memory stack is formed as a top-pinned configuration that forms the at least one FM layer above the tunnel barrier and above the free layer which is formed above the DMI layer with respect to a base substrate layer.

8. The memory device of claim 1, wherein the memory stack is formed as a bottom-pinned configuration that forms the at least one FM layer below the tunnel barrier and below the free layer which is formed below the DMI layer with respect to a base substrate layer.

9. The memory device of claim 1, wherein the free layer includes a magnetic alloy of at least one of Ni, Fe, or Co alloy, a CoFeB alloy, a FeB alloy, a Co/Ni multilayer configuration, and a CoFeGd alloy, wherein Co is Cobalt, Fe is Iron, B is Boron, Ni is nickel, and Gd is Gadolinium.

10. The memory device of claim 1, wherein the DMI layer includes at least one of Ta, W, Pt, Hf, Jr, Au, and AuPt alloy, wherein Ta is Tantalum, Pt is Platinum, Hf is Hafnium, Jr is Iridium, and Au is Gold.

11. The memory device of claim 1, wherein the at least one FM layer includes at least one of Ni, Fe, or Co, or at least one of CoFe, CoFeB layers, synthetic anti-ferromagnetic layers that include Ru spacer layers and antiferromagnetic pinning layers that include PtMn, IrMn, or FeMn, wherein Co is Cobalt, Fe is Iron, B is Boron, Pt is Platinum, Jr is Iridium, and Mn is Manganese.

12. The memory device of claim 1, wherein the tunnel barrier is at least one of MgO and $Al_2O_3$, wherein Mg is Magnesium, O is Oxygen, and Al is Aluminum.

13. A memory device, comprising:
   a memory stack formed on a substrate to program skyrmions within at least one layer of the memory stack, wherein the skyrmions represent logic states of the memory device, the memory stack further comprising:

top and bottom electrodes to receive electrical current from an external source and to provide the electrical current to the memory stack;

a free layer to store a logic state of the skyrmions in response to the electrical current;

a Dzyaloshinskii-Moriya (DM) Interaction (DMI) layer in contact with the free layer to induce the skyrmions in the free layer;

a tunnel barrier interactive with the free layer to facilitate storage and retrieval of the skyrmions in the free layer, wherein skyrmions of a positive topological charge +Q are created in the free layer based on a first voltage at the top and bottom electrodes, the first voltage at the top and bottom electrodes causing the electrical current to flow in a first direction, and the skyrmions of negative topological charge −Q are created in the free layer based on a second voltage at the top and bottom electrodes to cause the electrical current to flow in a second direction opposite the first direction in the memory stack;

at least one non-magnetic layer in contact with the DMI layer; and at least one fixed magnetic (FM) layer positioned within the memory stack, the at least one fixed FM layer with the at least one non-magnetic layer being configured to facilitate creation or annihilation of the skyrmions within the free layer in response to the electrical current.

14. The memory device of claim 13, wherein the skyrmions are polarized in a first polarization direction in response to the electrical current flowing in the first direction representing a first logic state and are polarized in a second polarization direction in response to the electrical current flowing in the second direction opposite the first direction representing a second logic state.

15. The memory device of claim 13, wherein the DMI layer includes layer side-edges that extend beyond a perimeter defined by memory stack side-edges of the memory stack, the layer side-edges being coupled to electrodes to facilitate writing and reading of the skyrmions in the free layer.

16. The memory device of claim 13, wherein the memory stack is formed as a top-pinned configuration that forms the at least one FM layer above the tunnel barrier and above the free layer which is formed above the DMI layer with respect to a base substrate layer.

17. The memory device of claim 13, wherein the memory stack is formed as a bottom-pinned configuration that forms the at least one FM layer below the tunnel barrier and below the free layer which is formed below the DMI layer with respect to a base substrate layer.

18. A memory device, comprising:

a memory stack formed on a substrate to program skyrmions within at least one layer of the memory stack that includes stack side-edges that define the perimeter of the stack, the skyrmions represent logic states of the memory device, the memory stack further comprising:

a top and bottom electrode to receive electrical current from an external source and to provide the electrical current to program the memory stack;

a free layer to store a logic state of the skyrmions in response to the electrical current;

a Dzyaloshinskii-Moriya Interaction (DMI) layer in contact with the free layer to induce the skyrmions in the free layer; the free layer coupled to electrodes to facilitate programming and detection of logic states of the skyrmions in the free layer;

a tunnel barrier interactive with the DMI layer to facilitate programming and detection of the skyrmions in the free layer, wherein the DMI layer includes layer side-edges that extend beyond the perimeter defined by the memory stack side-edges, the layer side-edges coupled to read electrodes to facilitate determining the logic state of the skyrmions in the free layer;

at least one non-magnetic layer in contact with the DMI layer; and at least one fixed magnetic (FM) layer positioned within the memory stack, the at least one fixed FM layer with the at least one non-magnetic layer being configured to facilitate programming and reading of the skyrmions within the free layer in response to the electrical current.

* * * * *